(12) United States Patent
Kim

(10) Patent No.: US 7,573,776 B2
(45) Date of Patent: Aug. 11, 2009

(54) SEMICONDUCTOR MEMORY DEVICE HAVING DATA-COMPRESS TEST MODE

(75) Inventor: Seung-Lo Kim, Kyoungki-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 238 days.

(21) Appl. No.: 11/528,533

(22) Filed: Sep. 28, 2006

(65) Prior Publication Data
US 2007/0070796 A1 Mar. 29, 2007

(30) Foreign Application Priority Data
Sep. 29, 2005 (KR) .................. 10-2005-0091571
May 4, 2006 (KR) .................. 10-2006-0040697

(51) Int. Cl.
G11C 8/00 (2006.01)

(52) U.S. Cl. ............... 365/230.06; 365/230.03; 365/230.05; 365/233.1

(58) Field of Classification Search ........... 365/230.06, 365/230.03, 230.05, 233.1
See application file for complete search history.

(56) References Cited

U.S. PATENT DOCUMENTS

| 6,717,834 B2 * | 4/2004 | Zagorianakos et al. ........ 365/63 |
| 6,795,899 B2 | 9/2004 | Dodd et al. |
| 6,958,935 B2 * | 10/2005 | Lee et al. ............ 365/185.11 |
| 7,017,010 B2 | 3/2006 | La |
| 7,133,995 B1 * | 11/2006 | Isaac et al. ............... 711/204 |
| 2003/0076719 A1 * | 4/2003 | Byeon et al. ............. 365/200 |
| 2005/0254307 A1 | 11/2005 | Dietrich et al. |
| 2006/0067158 A1 | 3/2006 | La |

FOREIGN PATENT DOCUMENTS

| JP | 11-7764 | 1/1999 |
| JP | 2002-008389 | 1/2002 |
| JP | 2005-235335 | 9/2005 |
| KR | 1998-057449 | 9/1998 |
| KR | 100242720 B1 | 11/1999 |
| KR | 10-2006-0059036 | 6/2006 |
| KR | 10-2006-0077813 A | 7/2006 |

OTHER PUBLICATIONS

Korean Office Action issued in corresponding Korean Patent Application No. KR 10-2006-0040697, issued on Jan. 7, 2008.
Korean Office Action, with English Translation, issued in corresponding Korean Patent Application No. 10-2006-0040697, dated on Jul. 16, 2007.

* cited by examiner

*Primary Examiner*—Pho M. Luu
(74) *Attorney, Agent, or Firm*—Mannava & Kang, P.C.

(57) ABSTRACT

A semiconductor memory device includes a plurality of column circuit units selectively operated with a burst length set in a mode register set. A plurality of column control blocks control column access to unit cells, each block activated by each of plural column control signals, and a column control signal generator outputs the plural column control signals to the plural column control blocks in response to a column access command and a burst length.

10 Claims, 4 Drawing Sheets

SEMICONDUCTOR MEMORY DEVICE HAVING DATA-COMPRESS TEST MODE

FIELD OF THE INVENTION

The present invention relates to a semiconductor memory device; and, more particularly, to a prefetch scheme in the semiconductor memory device.

BACKGROUND

Development of semiconductor memory devices has continuously improved with respect to operating speed and integration rate. A single data rate synchronous dynamic random access memory (hereinafter, referred to SDR SDRAM) was proposed to increase the operating speed. The SDR SDRAM inputs or outputs one of the data through a data pin during one period of an external clock, particularly in synchronization with a rising edge of the external clock. However, the SDR SDRAM is insufficient for a system operating at higher speed. Accordingly, a double data rate (DDR) SDRAM which inputs or outputs two data in one period of the external clock was developed. The DDR SDRAM continuously inputs or outputs two data through each data pin in synchronization with rising and falling edges in one period of the external clock. Therefore, a band width of the DDR SDRAM can be at least two times larger than that of the conventional SDR SDRAM without an increase of the clock frequency. The DDR SDRAM system thus can operate at the higher speed.

In further development, a prefetch is used to cope with a high speed operation of a DDR1/DDR2 SDRAM system. The prefetch is for reading and writing data corresponding to a burst length one of a single input or output command. For example, in case of a 2-bit prefetch in the DDR1 SDRAM, a minimum burst length becomes 2 bits. Accordingly, 2-bit data are input or output in one period of the external clock. For efficient data access, the semiconductor memory device inputs and outputs data in synchronization with rising and falling edges of the clock when exchanging the data with an external device. The device uses the 2-bit prefetch for processing in parallel two data in synchronization with one edge of the clock. In the DDR2 SDRAM, a 4-bit prefetch, wherein 4-bit data are read or written though each input/output pin concurrently, is implemented. A DDR3 SDRAM basically uses an 8-bit prefetch, when the burst length is 8-bits. However, the DDR3 SDRAM is designed to support both of the 4-bit and 8-bit prefetches.

The SDR SDRAM is provided with a mode register set (hereinafter, referred to MRS). The MRS stores information such as a burst type, a burst length, and a CAS latency for a variety of modes.

FIG. 1 is a block diagram of a DDR3 SDRAM in accordance with a conventional prefetch scheme.

As shown, the DDR3 SDRAM using 8-bit prefetch includes a bank BANK1 (the DDR3 SDRAM is provided with a plurality of banks but only one bank is described herein) and a column circuit unit group 10. The column circuit unit group 10 is provided with eight column circuit units 10A to 10H for 8-bit data, the maximum bit number of the prefetch. Meanwhile, a column control signal CCS is internally generated by a column access command CAC to enable the column circuit unit group 10 during a reading or writing operation of the DDR3 SDRAM.

FIG. 2 is a block diagram of the column circuit unit shown in FIG. 1.

Because the eight column circuit units 10A to 10H are composed of the same structure and operated in the response to the one column control signal CCS, one column circuit unit is described herein.

In detail, each of the column circuit units includes a data bus sense amplifier 24B, a column decoder 23B, a writing driver 25B, and a delay unit 22B. The data bus sense amplifier 24B amplifies data which are transferred from a cell to local input/output lines LIO and LIOB after sensing a voltage level of a bit line sense amplifier (not shown) during a reading operation. The column decoder 23B generates a signal YI to control a switch between the bit line sense amplifier and the local input/output lines based on an input address. Further, the writing driver 25B receives external input data during a writing operation. The delay unit 22B controls a timing of inputting the column control signal CCS to the data bus sense amplifier 24B, the column decoder 23B, and the writing driver 25B. Each of the column circuit units 10A to 10H performs an initial operation by the column control signal CCS generated internally when the column access command CAC for the reading or writing operation is input. Accordingly, each column circuit unit operates respectively and independently regardless of the operation of other column circuit units.

As described above, all column circuit units 10A to 10H start to operate in response to the column control signal CCS. Even though a burst length is 4 in the MSR, all column circuit units, i.e., the eight column circuits units, operate. Accordingly, the data bus sense amplifiers and the column decoders of all column circuit units operate in a reading operation, though not all output data are actually used. Unnecessary currents are consumed and power consumption is increased. In a writing operation, all column circuit units inclusive of unnecessary column circuit units also operate. If there is no data input, previous data latched on the local input/output lines LIO and LIOB can destroy data value in the cells.

SUMMARY OF THE INVENTION

It is, therefore, an object of the present invention to provide a semiconductor memory device having a plurality of column circuit units, each selectively performing an operation with a burst length set in a mode register set so that a prefetch operation is accomplished as intended.

In accordance with an aspect of the present invention, there is provided a semiconductor memory device including a plurality of column control blocks for controlling a column access to unit cells, each column control block activated by each of plural column control signals and a column control signal generator for outputting the plural column control signals to the plural column control blocks in response to a column access command and a burst length.

In accordance with another aspect of the present invention, there is provided a semiconductor memory device having a plurality of memory cells and including a plurality of column circuit units, the number of which corresponds to the number of maximum prefetch data, for column access in the memory cells and a column circuit control unit for selectively operating the plurality of column circuit units.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE INVENTION

Hereinafter, a semiconductor memory device in accordance with the present invention will be described in detail referring to the accompanying drawings.

Figure 3:
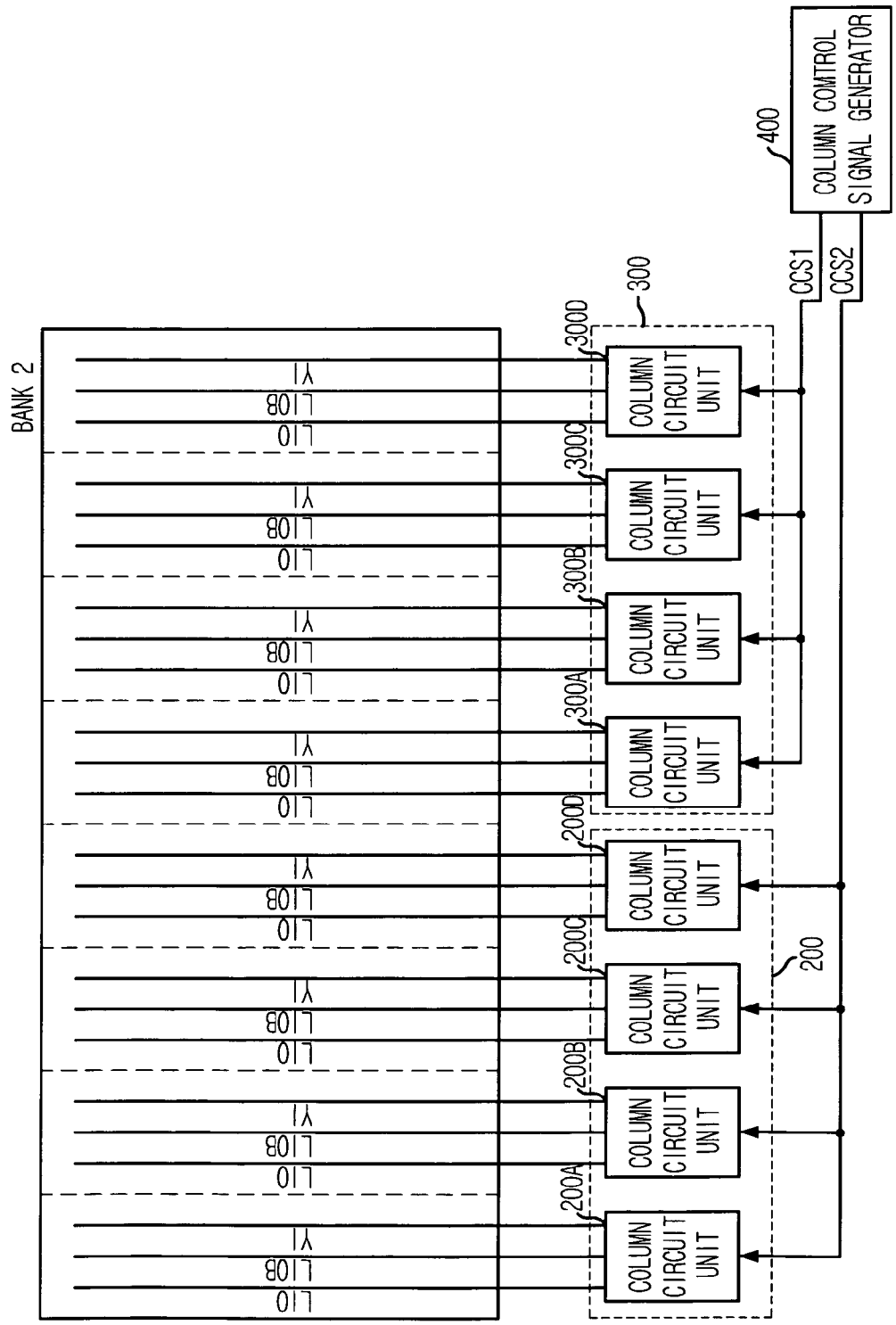
FIG. 3 is a block diagram of a DDR3 SDRAM employing scheme in accordance with the present invention.

FIG. 3 is a block diagram of a DDR3 SDRAM employing scheme in accordance with the present invention.

As shown, the DDR3 SDRAM using 8-bit prefetch includes bank BANK2 (a semiconductor memory device is generally provided with a plurality of banks but only one bank is described herein) and first and second column circuit unit groups 200 and 300. The first and the second column circuit unit groups 200 and 300 are provided with eight column circuit units 200A to 200D and 300A to 300D corresponding to the 8-bit prefetch, i.e., the maximum bit number of a prefetch. The first and the second column circuit unit groups 200 and 300 are split based on which one of column control signals CCS1 and CCS2 output from a column control signal generator 400 is input. The first and the second column circuit unit groups 200 and 300 are respectively connected with column control signal lines in order to transmit one of the first and the second column control signals CCS1 and CCS2.

The first and second column control signals CCS1 and CCS2 enable the column circuit unit groups 200 to 300. The column control signals CCS1 and CCS2 are internally generated in response to a column access command CAC by the column control signal generator 400 during a reading or writing operation of the DDR3 SARAM.

Figure 1:
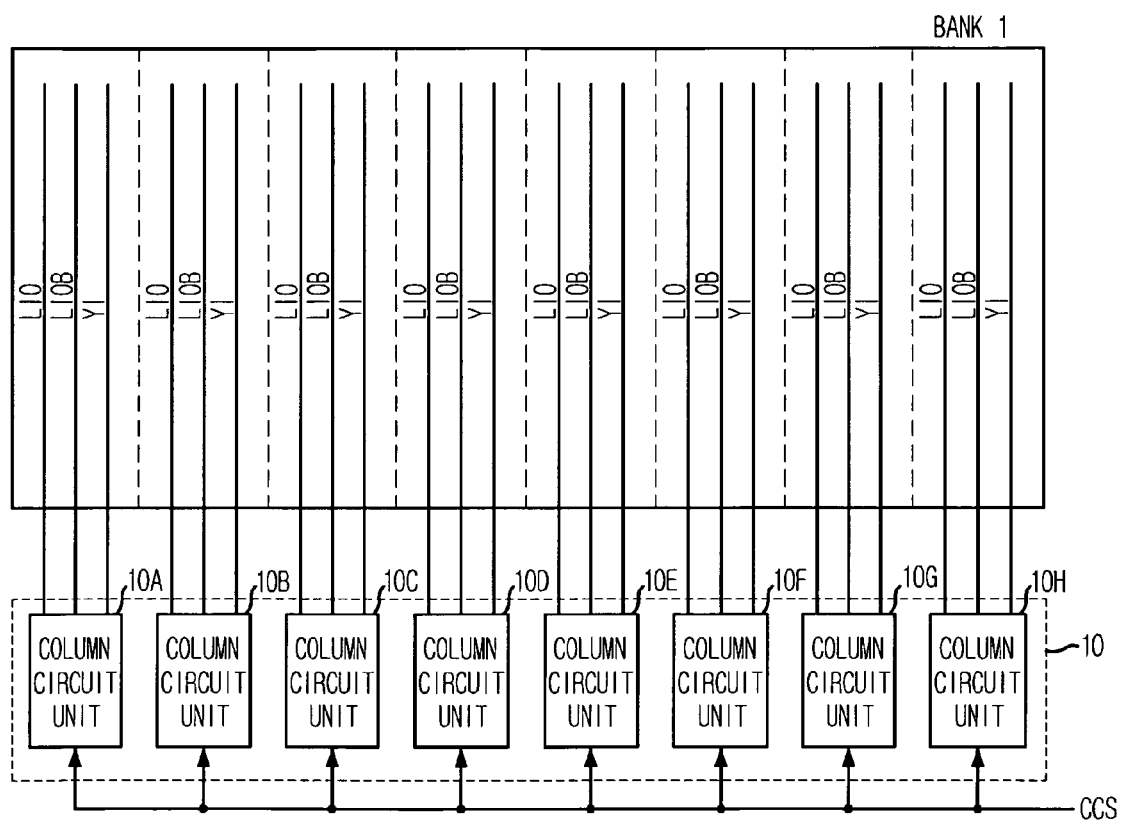
FIG. 1 is a block diagram of a DDR3 SDRAM in accordance with a conventional prefetch scheme.
Figure 2:
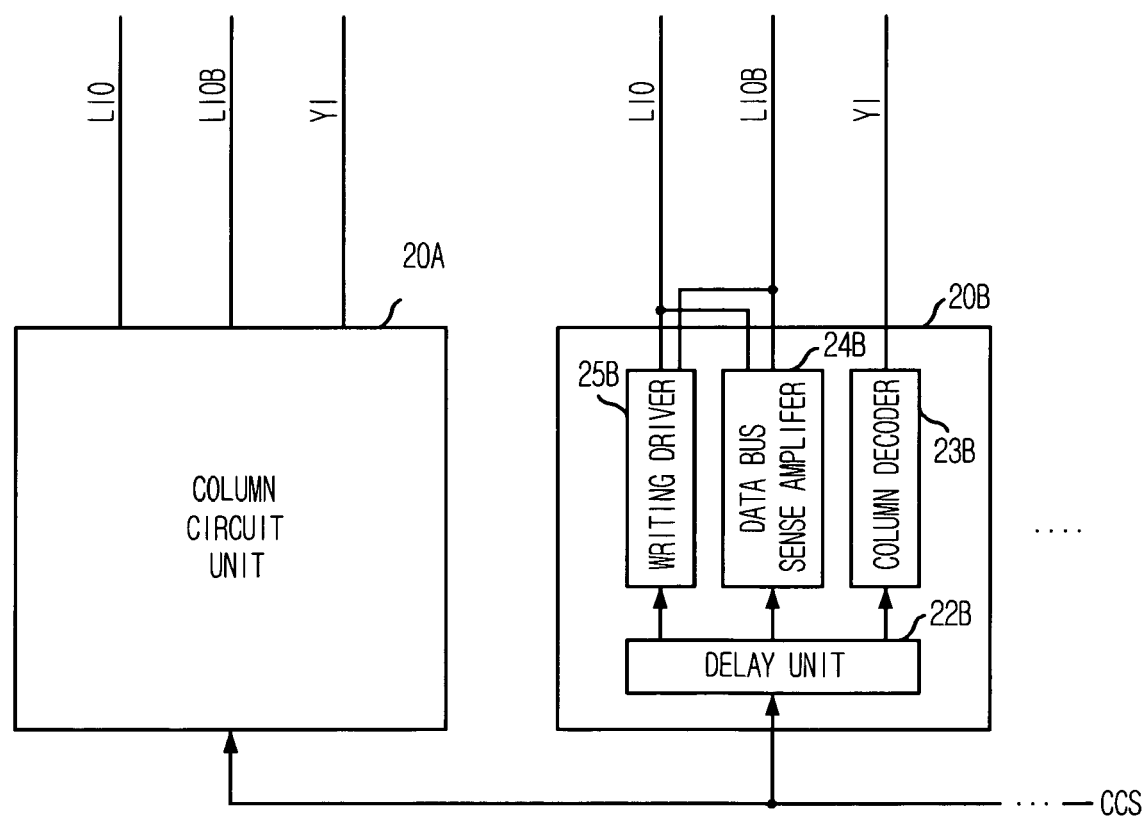
FIG. 2 is a block diagram of a column circuit unit shown in FIG. 1.

Herein, the column circuit units 200A to 200D and 300A to 300D respectively include a column decoder, a data bus sense amplifier, a writing driver, and a delay unit, similar to the conventional column circuit unit shown in FIG. 1. Each column decoder selects a column line in response to one of the first and the second column control signals CCS1 and CCS2. The data bus sense amplifier amplifies data value on the column line. The writing driver supports the column line with writing data value. The delay unit controls a timing of inputting the column control signal CCS1 or CCS2 to the column decoder, the data bus sense amplifier, and the writing driver. Detailed operation is same as that of the conventional column circuit units. Therefore, a detailed description of the operation of column circuit units is omitted.

Hereinafter a 8-bit prefetch operation is described in detail. The two column control signals CCS1 and CCS2 input into the eight column circuit units 200A to 200D and 300A to 300D are enabled to thereby perform the 8-bit prefetch operation. If a 4-bit prefetch operation is required, only one of the two column control signals CCS1 and CCS2 is enabled. Therefore, four column circuit units included in one of the first and the second column circuit unit groups 200 and 300 operate, and the 4-bit prefetch operation can be performed. For example, for a 2-bit prefetch operation, the eight column circuit units can be split into four groups. If, among the four groups, only one group is operated by one of the four column control signals, the 2-bit prefetch operation is performed by only two column circuit units exclusive of unnecessary column circuit units.

Figure 4:
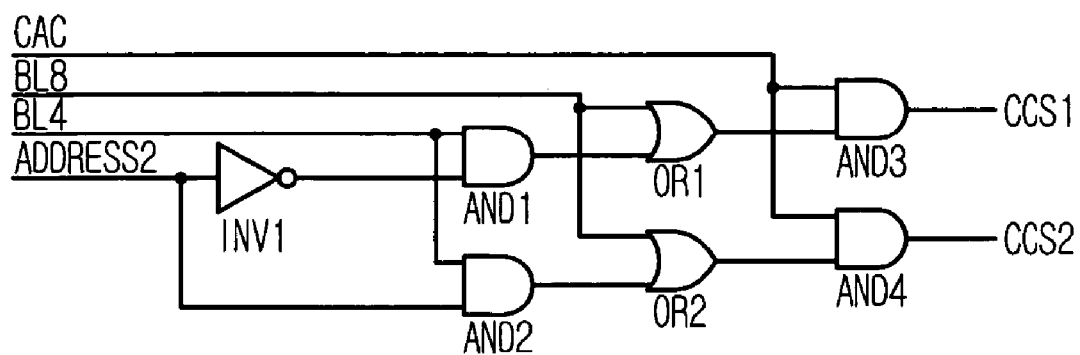
FIG. 4 is a schematic circuit diagram of a column control signal generator shown in FIG. 3.

FIG. 4 is a schematic circuit diagram of a column control signal generator shown in FIG. 3.

As shown, input signals of the column control signal generator are determined. A column access command CAC is an input signal for column access during a reading or writing operation in a semiconductor memory device. Burst length signals BL4 and BL8 are selectively generated according to a preset value programmed in a MRS. In an operation of an 8-bit burst length, the 8-bit burst length signal BL8 becomes a logic high state, while the 4-bit burst length signal BL 4 is a logic low state. On the contrary, while 8-bit burst length signal BL8 changes to a logic low level, the 4-bit burst length signal BL4 changes to a logic high level in an operation of a 4-bit burst length. And a column address signal ADDRESS2 is used as a reference signal to select one of the column circuit unit groups 200 and 300 in the 4-bit or 8-bit prefetch operation.

In detail, the column control signal generator 400 includes an inverter INV1, four AND gates AND1 to AND4, and two OR gates OR1 and OR2. The inverter INV1 inverts the column address signal ADDRESS2. The first AND gate AND1 performs a logic AND operation to the 4-bit burst length signal BL4 and an output signal of the inverter INV1. The second AND gate AND2 performs a logic AND operation to the 4-bit burst length signal BL4 and the column address signal ADDRESS2. The first OR gate OR1 receives the 8-bit burst length signal BL8 and an output signal of the first AND gate AND1. The second OR gate OR2 receives the 8-bit burst length signal BL8 and an output signal of the second AND gate AND2. The third AND gate AND3 receives the column access command CAC and an output signal of the first OR gate OR1 to output the first column control signal CCS1. The fourth AND gate AND4 receives the column access command CAC and an output signal of the second OR gate OR2 to output the second column control signal CCS2.

During the 8-bit prefetch operation, the first and the second column control signals CCS1 and CCS2 become a logic high state according to the 8-bit burst length signal BL8. Then, the 8-bit prefetch operation is performed by the eight column circuit units 200A to 200D and 300A to 300D activated by the column circuit signal CCS1 or CCS2. Meanwhile, in the 4-bit prefetch operation, one of the first and the second column control signals CCS1 and CCS2 is in a logic high state in response to the 4-bit burst length signal BL4, the 8-bit burst length signal BL8, and the column address signal ADDRESS2. The 4-bit prefetch operation is performed by activating one group of the column circuit unit groups 200 and 300.

Therefore, by adjusting the number of the column control signals to activate the column circuit units in accordance with the present invention, the 4-bit prefetch as well as the 8-bit prefetch can operate in the DDR3 SDRAM designed for the 8-bit prefetch operation. If a semiconductor memory device generate additional column address signals, the 2-bit prefetch operation is also possible.

Based on the burst length recorded in the MRS, it is possible to selectively operate column circuit units among the plurality of column circuit units whose number corresponds to the number of maximum prefetch data. The prefetch operation for needs is performed by the activated column circuit units.

In the presented invention, the number of column circuit units activated is determined according to a required bit of prefetch operation. Current consumption due to unnecessary column circuit units is reduced. Particularly in writing operation, any unintended data collision in cells is prevented.

The present application contains subject matter related to Korean patent applications Nos. 2005-0091571 and 2006-0040697, filed in the Korean Patent Office on Sep. 29, 2005 and May 4, 2006, respectively, the entire contents of which are incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A semiconductor memory device, comprising:
    a plurality of column control blocks for controlling a column access to unit cells, each column control block activated by each of plural column control signals; and
    a column control signal generator for outputting the plural column control signals to the plural column control blocks in response to a column access command and a burst length.

2. The semiconductor memory device as recited in claim 1, wherein the number of activated column control blocks is determined by a burst length.

3. The semiconductor memory device as recited in claim 2, wherein the number of column control signals is adjusted based on the burst length.

4. A semiconductor memory device having a plurality of memory cells, comprising:
    a plurality of column circuit units, the number of which corresponds to a number of maximum prefetch data, for column access in the memory cells; and
    a column circuit control unit for selectively operating the plurality of column circuit units based on a burst length.

5. The semiconductor memory device as recited in claim 4, further comprising:
    a mode register set wherein information related to the burst length is recorded.

6. The semiconductor memory device as recited in claim 5, wherein the burst length set into the mode register set determines the number of the plurality of column circuit units for an operation.

7. The semiconductor memory device as recited in claim 4, wherein the column circuit control unit includes:
    a first control signal generator for operating the column circuit units, the number of which is lower than the number of maximum prefetch data;
    a second control signal generator for operating the column circuit units, the number of which is lower than the number of maximum prefetch data; and
    a control signal decoding unit for receiving a signal about the burst length and operating the first and the second control signal generators.

8. The semiconductor memory device as recited in claim 4, wherein a bank comprises eight column circuit units; and eight column circuit units operate when the burst length is set to 8-bit, and four column circuit units operate when the burst length is set to 4-bit.

9. The semiconductor memory device as recited in claim 4, wherein a bank comprises eight column circuit units; and eight column circuit units operate when the burst 15 length is set to 8-bit, four column circuit units operate when the burst length is set to 4-bit, and two column circuit units operate when the burst length is set to 2-bit.

10. The semiconductor memory device as recited in claim 4, wherein each column circuit unit includes: a column decoder for selecting a column line in response to column control signals; a data bus sense amplifier for amplifying data value; a writing driver for providing the column line with writing data value; and a delay unit for controlling a timing of inputting the column control signals to the column decoder, the data bus sense amplifier, and the writing driver.

* * * * *